United States Patent [19]
Kiyokawa

[11] Patent Number: 5,531,556
[45] Date of Patent: Jul. 2, 1996

[54] REARRANGEMENT APPARATUS FOR MANUFACTURING SYSTEM

[75] Inventor: Kenji Kiyokawa, Kanagawa, Japan

[73] Assignee: Sony Corporation, Tokyo, Japan

[21] Appl. No.: 280,451

[22] Filed: Jul. 26, 1994

[30] Foreign Application Priority Data

Jul. 30, 1993 [JP] Japan .................................. 5-190308

[51] Int. Cl.⁶ ........................................................ B65H 9/08
[52] U.S. Cl. ............................ 414/225; 901/33; 414/589; 414/751; 414/783
[58] Field of Search ..................................... 414/225, 287, 414/403, 589, 591, 783, 799, 751, 735; 901/33

[56] References Cited

U.S. PATENT DOCUMENTS

| | | | |
|---|---|---|---|
| 4,664,591 | 5/1987 | Faes et al. ............................... | 414/783 |
| 4,911,598 | 3/1990 | Savary et al. ........................... | 414/736 |
| 4,988,252 | 1/1991 | Yamamoto et al. ..................... | 414/225 |
| 5,002,448 | 3/1991 | Kamijima et al. ...................... | 414/225 |
| 5,040,291 | 8/1991 | Janisiewicz et al. ................... | 414/225 |
| 5,142,956 | 9/1992 | Ueno et al. ............................. | 414/783 |
| 5,310,039 | 5/1994 | Butero et al. ........................... | 414/225 |

*Primary Examiner*—Karen B. Merritt
*Assistant Examiner*—Gregory A. Morse
*Attorney, Agent, or Firm*—Ronald P. Kananen

[57] ABSTRACT

A plurality of main and sub-chucks are used in a manner wherein the main chucks are used to pick up objects from a first tray, to move the objects to a second tray, and to place them in the second tray in exactly the desired positions. A floating mechanism allows the main chucks to slide from side to side while the sub-chucks are released. The sub-chucks are arranged to grasp a fixed centering structure and to center the main chucks in exactly the required positions for the precision placement of the objects. During the operations wherein the objects are picked up from the first tray, the sub-chucks are released so that during the pickup operation, the main chucks may center on the objects which are being picked up. After the objects are grasped, the sub-chucks are closed to re-center the main chucks in exactly the positions required for accurate placement.

7 Claims, 5 Drawing Sheets

REARRANGEMENT APPARATUS FOR MANUFACTURING SYSTEM

BACKGROUND OF THE INVENTION

The present invention relates to a rearrangement apparatus for manufacturing system and, particularly to a parts conveying apparatus for accurately picking-up parts accommodated in a coarse parts accommodating portion, such as a tray or the like, and accurately conveying the picked-up parts to a parts accommodating portion of another tray, for example, or accurately assembling the parts to a predetermined position of a machine to be assembled.

In the production line of electronic equipment, accessories or the like, when assembly parts are attached to an apparatus body, a teachable assembling robot fixed on a floor (referred to hereinafter as "teaching playback robot" or simply "robot", if necessary) is used to attach the parts to the apparatus body which is conveyed by some suitable means, such as a belt conveyor or the like.

When the apparatus body is a data cartridge body and the parts thereof are mirrors, the mirrors as parts are supplied by a parts supplier or the like in the state that each of the mirrors are placed into a tray having a plurality of "coarse" mirror accommodating portions. Such mirrors are used to detect an end of a data tape accommodated in a cartridge body. The mirror is assembled to the cartridge body so as to be positioned inboard of a data tape having a sensor hole formed at its end.

This data cartridge is inserted into a data streamer body, whereby a light emitting unit and a photo-sensing unit of a photo-detector disposed in the data streamer body are opposed to the mirror through the data tape. When the data streamer is energized to transport the data tape to the tape end, light emitted from the light emitting unit is transmitted through the sensor hole, and reflected by the mirror. Reflected light is sensed by the photo-sensing portion. Thus, the end of the data tape is detected, and the data streamer is stopped. If the mirror that acts as described above is inaccurately attached, the light reflected by the mirror is apt not to be sensed by the photo-sensing unit, and the end of the data tape may not be detected. For this reason, the mirror must be attached with high accuracy.

However, the above-mentioned teaching playback robot cannot directly pick up the mirror from the coarse mirror accommodating portion and cannot assemble the same to the cartridge body because the teaching playback robot cannot pick up the mirror if the mirror is not placed in exactly the position which is previously learned by the teaching playback robot.

Therefore, it is customary that the user temporarily moves mirrors from a tray having dimensionally coarse mirror accommodating portions to a tray having highly-accurate mirror accommodating portions, i.e., mirror accommodating portions with accuracy corresponding to the accuracy of the allowable position range of the teaching playback robot in a manual fashion.

Alternatively, the user picks up the mirrors from a tray having a dimensionally-coarse mirror accommodating portions and rearranges the picked up mirrors on a parts rearrangement rack.

However, if the user replaces the mirrors in a manual fashion, this work is low in efficiency so that the assembled apparatus (data cartridge body with the mirror assembled thereto in the above example) becomes expensive.

In order to improve this situation, there is proposed a method in which a part's position is recognized and specified by a robot having a video camera and in which the specified part is picked up and attached to the apparatus body by the robot. In this case, however, the amount of image data which needs to be processed is enormous and therefore it takes a long time to pick up the parts. As a result, the efficiency of the mass production line is lowered, and the assembled apparatus cannot be made inexpensively. In addition, considering the overall arrangement of the apparatus composed of the robot with the video camera and the video data processing apparatus for processing video data from the video camera, there is then the defect that the whole robot apparatus become extremely complex.

SUMMARY OF THE INVENTION

In view of the aforesaid aspects, it is an object of the present invention to provide an apparatus for conveying parts in which parts can be easily grasped from a tray having a coarse-accuracy parts accommodating portion and rearranged in another tray with high accuracy.

It is another object of the present invention to provide an apparatus for conveying parts in which parts can be easily grasped from a tray having a plurality of coarse-accuracy parts accommodating portions and rearranged in another tray with high accuracy.

According to a first aspect of the present invention, there is provided an apparatus for grasping parts accommodated in a first parts accommodating portion in which a plurality of parts are accommodated, and conveying the grasped parts to a second parts accommodating portion in which a plurality of parts are accommodated. This apparatus comprises a plurality of main chucks, each having a first chuck member composed of a pair of chuck levers movable in a first direction between a closed position to grasp the parts and an opened position to release the parts, a plurality of support members for supporting the plurality of main chucks so that the plurality of main chucks are slidable in the first direction, respectively, a plurality of sub-chucks formed so as to move unison with the plurality of support members respectively, each of the sub-chucks having a second chuck member movable between a closed position to fix corresponding one of the plurality of main chucks at a predetermined position in the first direction, and an opened position to allow the corresponding one of the main chucks to move in the first direction, and a conveying means for integrally conveying the plurality of main chucks and the plurality of sub-chucks from a first position at which the first parts accommodating portion can be accessed to a second position at which the second parts accommodating portion can be accessed, wherein when the parts are grasped in the first parts accommodating portion, the first chuck members are moved from the opened positions to the closed positions under the state that the second chuck members are set in the opened positions, and the second chuck members are moved from the opened positions to the closed positions until the grasped parts are accommodated in the second parts accommodating portion so that the plurality of main chucks are fixed to the predetermined positions in the first direction, respectively.

In accordance with a second aspect of the present invention, there is provided an apparatus for conveying parts for grasping parts accommodated in a first parts accommodating portion, and conveying the grasped parts to a second parts accommodating portion. This apparatus comprises a main chucks having a first chuck member movable in a first direction between a closed position to grasp the parts and an opened position to release the parts, a support member for supporting the main chuck so that the main chuck becomes slidable in the first direction, a sub-chuck formed so as to move unison with the support members, the sub-chuck having a second chuck member movable between a closed position to fix main chuck at a predetermined position in the first direction, and an opened position to allow the main chuck to move in the first direction, and a conveying means for integrally conveying the main chuck and the sub-chuck from a first position at which the first parts accommodating portion can be accessed to a second position at which the second parts accommodating portion can be accessed, wherein when the parts are grasped in the first parts accommodating portion, the first chuck member is moved from the opened position to the closed position under the state that the second chuck member is set in the opened position, and the second chuck member is moved from the opened position to the closed position until the grasped parts are accommodated in the second parts accommodating portion so that the main chuck is fixed to the predetermined position in the first direction.

DETAILED DESCRIPTION OF THE PREFERRED EMBODIMENT

Figure 1:
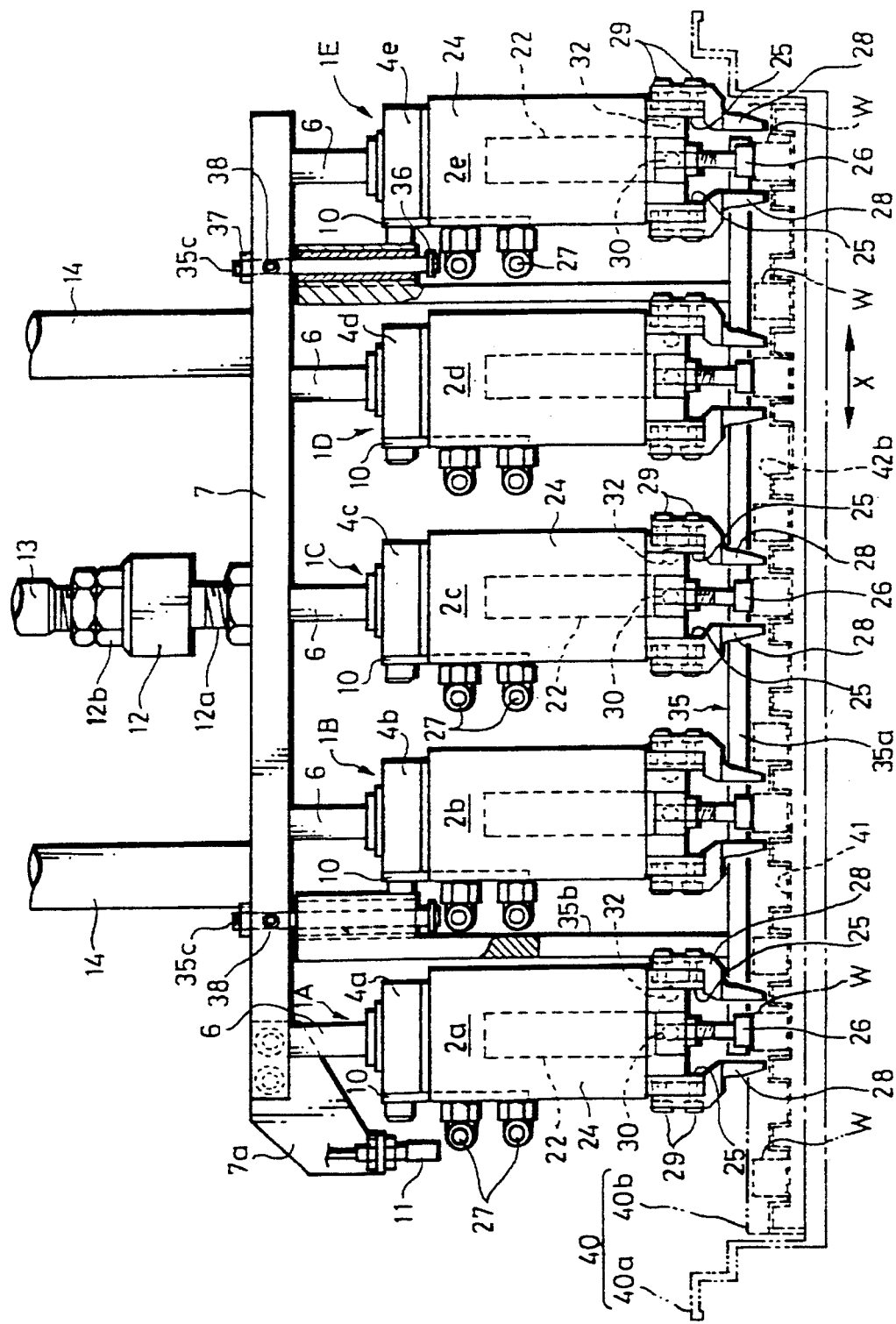
FIG. 1 is a front view showing an apparatus for conveying parts according to an embodiment of the present invention.
Figure 2:
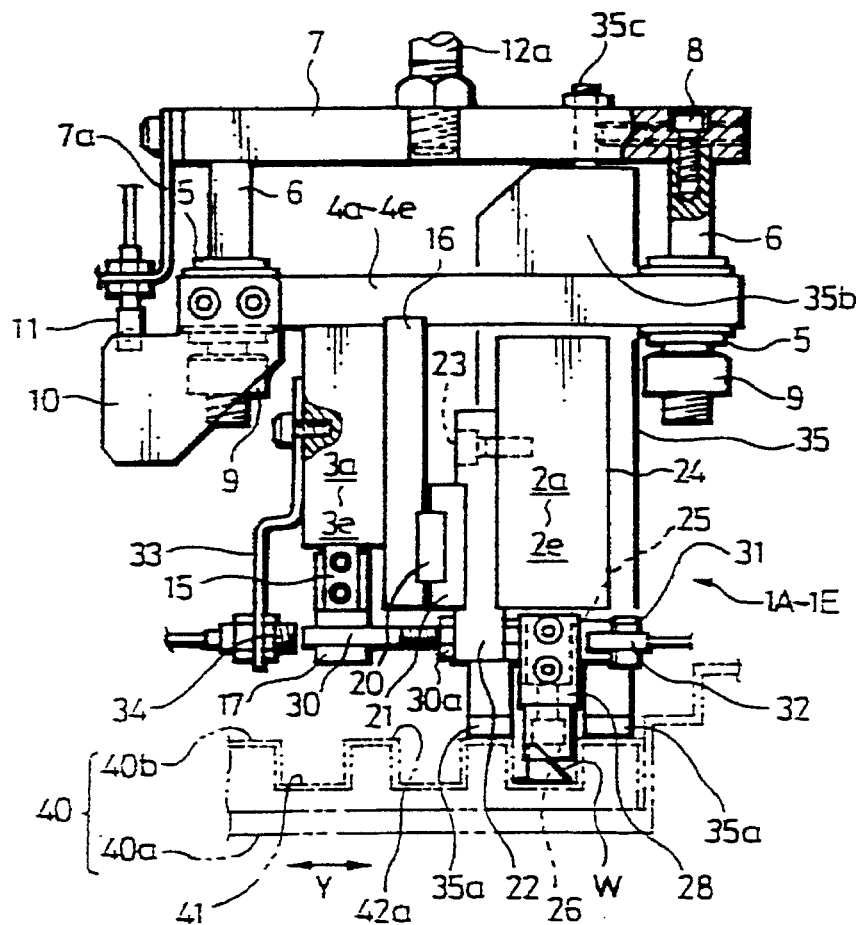
FIG. 2 is a side view of the apparatus for conveying parts shown in FIG. 1.
Figure 3:
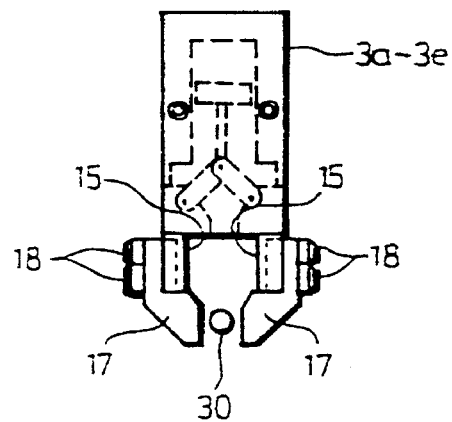
FIG. 3 is a rear view of a sub-chuck used in the embodiment of the present invention.

An apparatus for conveying parts according to an embodiment of the present invention will be described below with reference to FIGS. 1 to 6. In this embodiment, the present invention is applied to an apparatus for conveying mirrors W, provided as specific examples of parts for detecting the end of a data tape used in a data cartridge, from a tray having dimensionally-coarse parts accommodating portions to another tray. As shown in FIGS. 1 to 3, this apparatus includes five sets of chuck units 1A to 1E which can grasp five mirrors W simultaneously.

As shown in FIG. 1, the five sets of chuck units 1A to 1E are constructed by the same constituent elements. Specifically, the respective chuck units 1A to 1E include main chucks 2a to 2e, sub-chucks 3a to 3e and movable arms 4a to 4e. The movable arms 4a to 4e each include sleeves 5 which are secured to their front and rear ends (see FIG. 2), and which have a vertical through-hole. Guide bars 6 are fitted into the through-holes of the respective sleeves 5. The upper ends of the guide bars 6 are fixed to the lower surface of a flat-shaped base plate 7 by screws 8, respectively. The movable arms 4a to 4e are prevented from dropping by stoppers 9 that are secured by nuts to screw portions formed on the lower end portions of the respective guide bars 6.

Therefore, the movable arms 4a to 4e can be elevated and lowered between the base plate 7 and the stoppers 9 by the pair of guide bars 6, 6. It is possible to adjust the height positions of the movable arms 4a to 4e by rotating the stoppers 9.

As shown in FIG. 2, the movable arms 4a to 4e include light-shielding members 10 fixed thereto to indicate the height positions of the main chucks 2a to 2e. The base plate 7 includes sensors 11 attached thereto in response to the light-shielding members 10 to detect whether or not parts are accommodated in a parts accommodating tray 40. As the sensor 11, there can be applied a reflection-type photo-sensor which houses a light emitting unit and a photo-sensing unit, for example. The light emitting unit and the photo-sensing unit are disposed such that they can detect the upper and lower movement of the light-shielding member 10.

The sensors 11 is adapted to output a detected signal when the main chucks 2a to 2e are placed at the predetermined height positions relative to the guide bars 6.

Figure 4:
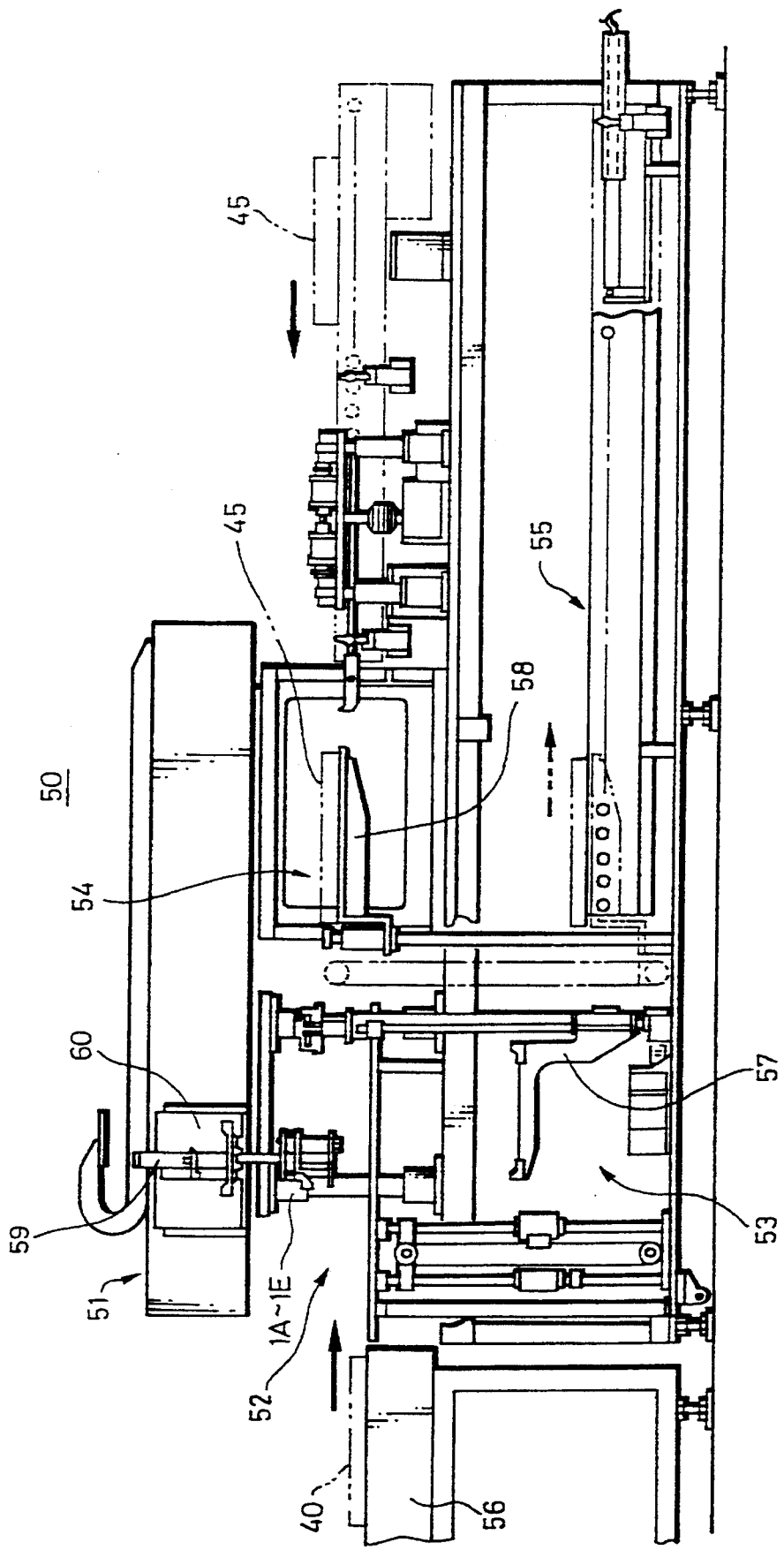
FIG. 4 is a front view showing an example in which the embodiment of FIG. 1 is applied to a tray-type parts rearrangement apparatus.
Figure 5:
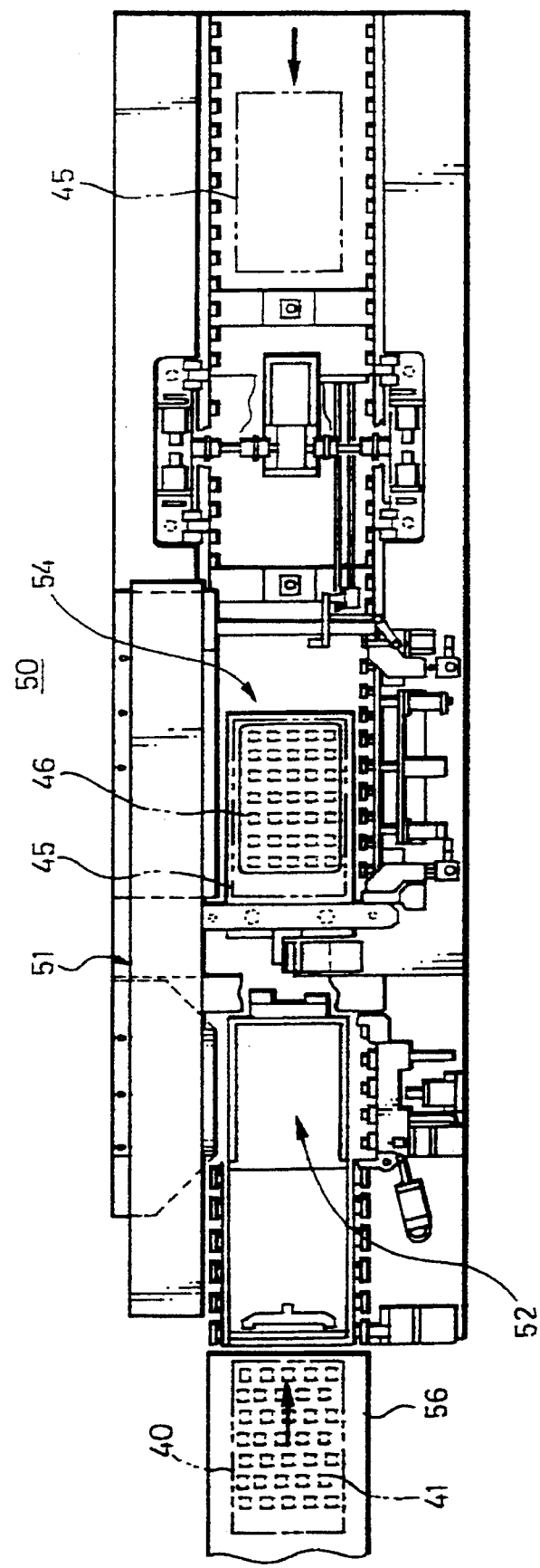
FIG. 5 is a plan view of the example of FIG. 4.

The base plate 7 has fixed at its central portion, a connection member 12 by a screw shaft portion 12a provided at one side of the connection member 12. A lower end portion of a piston rod 13 of a center cylinder 59 that simultaneously elevates and lowers the five sets of the chuck units 1A to 1E is coupled by a screw (not shown) to a nut portion 12b formed on the other side of the connection member 12. Guide rods 14 are adapted to elevate and lower the five sets of the chuck units 1A to 1E in a straight line. The respective guide rods 14, 14 are fixed at their lower ends to the upper surface of the base plate 7 and elongated upwardly in parallel to the piston rod 13. As shown in FIGS. 4 and 5, a conveying means 60 of a conveying unit 51 is joined to the upper portions of these piston rod 13 and guide rods 14, 14.

As shown in FIG. 2, the movable arms 4a to 4e have their lower surfaces fixed to the upper end portions of the sub-chucks 3a to 3e and an upper end portion of a plate-shaped fixing member 16 which also serves as the reinforcing member of the sub-chucks 3a to 3e by some suitable fixing means, such as fixing screws (not shown) or the like such that a pair of translating members 15, 15 (see also FIG. 3) that are translated in the direction perpendicular to the sheet of drawings by an air pressure, are oriented in the lower direction.

The sub-chucks 3a to 3e are adapted to fix the main chucks 2a to 2e at predetermined positions, respectively, and to be connected to an air pressure source by some pipe members, not shown.

The pair of translating members 15, 15 are translated by supplying an air from the air pressure source to one of the cylinder spaces separated by a piston. A pair of chuck levers 17, 17 are fastened to the pair of translating members 15, 15 of each of the sub-chucks 3a to 3e by mount screws 18, respectively. Accordingly, as the translating members 15, 15 are translated by the air pressure, the two chuck levers 17 are parallelly moved in the direction perpendicular to the sheet of drawings so that the two chuck levers 17, 17 come close to each other or come away from each other.

The fixing member 16 includes a guide plate 20 fixed on a surface opposite to the sub-chucks 3a to 3e. The guide plate 20 is in engagement with a slide member 21 of U-shaped cross-section so that the slide member 21 can be slid in the direction perpendicular to the sheet of drawings. At least one of the guide plate 20 and the slide member 21 is made of a material whose friction coefficient is extremely small, such as a bearing metal, so that a force generated by the sliding resistance at that portion becomes smaller than a grasping force of each of the main chucks 2a to 2e. The guide plate 20 and the slide member 21 constitute a specific example of a floating mechanism for holding the main chucks 2a to 2e such that the main chucks 2a to 2e can be freely translated in the direction perpendicular to the sheet of drawings.

The respective slide members 21 include attachment members 22 fixed thereto by some fixing means, such as screws (not shown) or the like. The main chucks 2a to 2e are separately fixed to the attachment members 22 by screws 23. The attachment members 22 include on their upper portions, upper projecting portions projected toward the slide member 21 side, and also include on their lower portions lower protecting portions projected toward the main chucks 2a to 2e. Therefore, apart from the above-mentioned fixing means, the upper projecting portions can prevent the slide member 21 from moving downwardly and the lower projecting member can support the main chucks 2a to 2e upwardly so that the main chucks 2a to 2e can be prevented from moving downwardly.

The main chucks 2a to 2e include a cylinder portion 24 operable by an air pressure, a pair of translating members 25, 25 that are parallelly translated by the cylinder portion 24 in the direction shown by an arrow X and an abutting member 26 disposed between the two translating members 25 and 25. An air pressure source, not shown, is connected to the cylinder portion 24 by means of a piping member 27. The pair of translating members 25, 25 include a pair of chuck levers 28, 28 which are fixed thereto by mount screws 29 respectively. The two chuck lever 28, 28 are parallelly translated in the arrow X direction in unison with the translating members 25, 25 so that the chuck levers 28, 28 come close to each other or come away from each other.

The abutting member 26 is formed by a combination of a pair of bolt and nut. The bolt of the abutting member 26 is screwed to the lower surface of the cylinder portion 24 so that the head portion thereof is disposed between the chuck levers 28 and 28. The positioning nut is attached to a screw portion of the bolt. Accordingly, it is possible to adjust the height of the pair of chuck levers 28, 28 relative to the lower end surface by changing the downward projected amount of the abutting member 26.

The attachment member 22 includes on its lower portion attached a hold shaft 30 and a sensor bracket 31. Each of the sensor brackets 31 includes attached at its tip end, a lever open/close detection sensor 32 to detect whether the chuck levers 28, 28 are opened or closed. As the lever open/close detection sensor 32, there can be applied a reflection-type photosensor which houses a light emitting unit and a photo sensor unit. The light emitting unit and the photo sensor unit are disposed on the side of one of the translating members 25 in such a way that they can detect the motion of one of the pair of translating members 25 (may be the chuck levers 28). The light emitting unit and the photo sensor unit can detect, on the basis of the position of one translating member 25, whether the pair of chuck levers 28, 28 are in the opened state or in the closed state.

The hold shaft 30 comprises a rod-like member which has a screw portion formed on its one end. The screw portion of the hold shaft 30 is fixedly screwed to the attachment member 22 so that it is positioned at substantially the intermediate portion of the pair of translating members 25, 25. A shaft portion of the hold shaft 30 is elongated rearwardly, horizontal, and positioned between the pair of chuck levers 17, 17 of each of the sub-chucks 3a to 3c. The hold shaft 30 further includes a lock nut 30a. It is therefore possible to adjust the projection amount of the hold shaft 30 by turning the hold shaft 30 after the lock nut 30a is loosened.

In association with the hold shaft 30, each of the sub-chucks 3a to 3e includes on its rear surface attached a sensor bracket 33. The sensor bracket 33 includes on its lower portion a lever open/close detection sensor 34 to detect the opened or closed state of the chuck levers 17, 17. As the lever open/close detection sensor 34, there can be applied the reflection type photo sensor which houses a light emitting unit and a photo sensor unit, similarly to the detection sensor 32. The light emitting unit and the photo sensor unit of the detection sensor 34 are disposed on the side of one translating member 15 so that they can detect the movement of one of the pair of translating members 15, 15 (chuck lever 17 may be possible). The detection sensor 34 can detect on the basis of the position of one translating member 15 whether the pair of chuck levers 17, 17 are opened or closed.

A tray pushing member 35 is adapted to prevent the parts accommodating tray 40 from being deformed. The tray pushing member 35 is composed of a pair of pushing plates 35a, 35a spaced apart by a predetermined distance in the front and rear direction and which are parallelly extended in the horizontal direction, a pair of support plates 35b, 35b whose bifurcated lower ends are respectively fixed to the opposing end portions of the pushing plates 35a, 35a and suspension shafts 35c, 35c for supporting the upper end portions of the upwardly elongated support plates 35b, 35b so that the pushing plates 35b, 35b are freely slidable.

Each of the support plates 35b includes an upper end portion penetrated by the suspension shaft 35c so that the suspension shaft 35c can freely slide up and down in the vertical direction. The support plate 35b can be prevented from being detached by a washer 36 attached to the lower end portion of the suspension shaft 35c. Each of the suspension shaft 35c includes, on its upper portion, a screw portion which penetrates the base plate 7 in the upper and lower direction. Each of the suspension shafts 35c is suspended from the base plate 7 by a nut 37 screwed to a screw portion projected over the base plate 7. A lock screw 38 is adapted to fix the suspension shaft 35c to the base plate 7 by pushing the suspension shaft 35c laterally.

The parts accommodating tray 40 is composed of an outer tray 40a and an inner tray 40b, both of which are made of appropriate synthetic resin materials. The inner tray 40b is accommodated in a concave portion of the outer tray 40a. The inner tray 40b has a plurality of parts accommodating portions 41 constituted by rectangular concave portions aligned both in the longitudinal and lateral directions. These concave portions are low in dimensional accuracy. The mirrors W are separately accommodated in the respective parts accommodating portions 41.

Each of the parts accommodating portions 41 of the inner tray 40b is formed so as to be surrounded by partition portions 42a expanded in the right and left direction (X-direction in FIG. 1) of the tray 40, and small partition portions 42b extended in the direction (Y-direction in FIG. 2) intersecting the partition portions 42a. The pair of pushing plates 35a and 35a of the tray pushing member 35 are respectively urged against the partition portions 42a, 42a disposed ahead of and behind the mirror W to be grasped, so that the inner tray 40b is prevented from being deformed.

Figure 6:
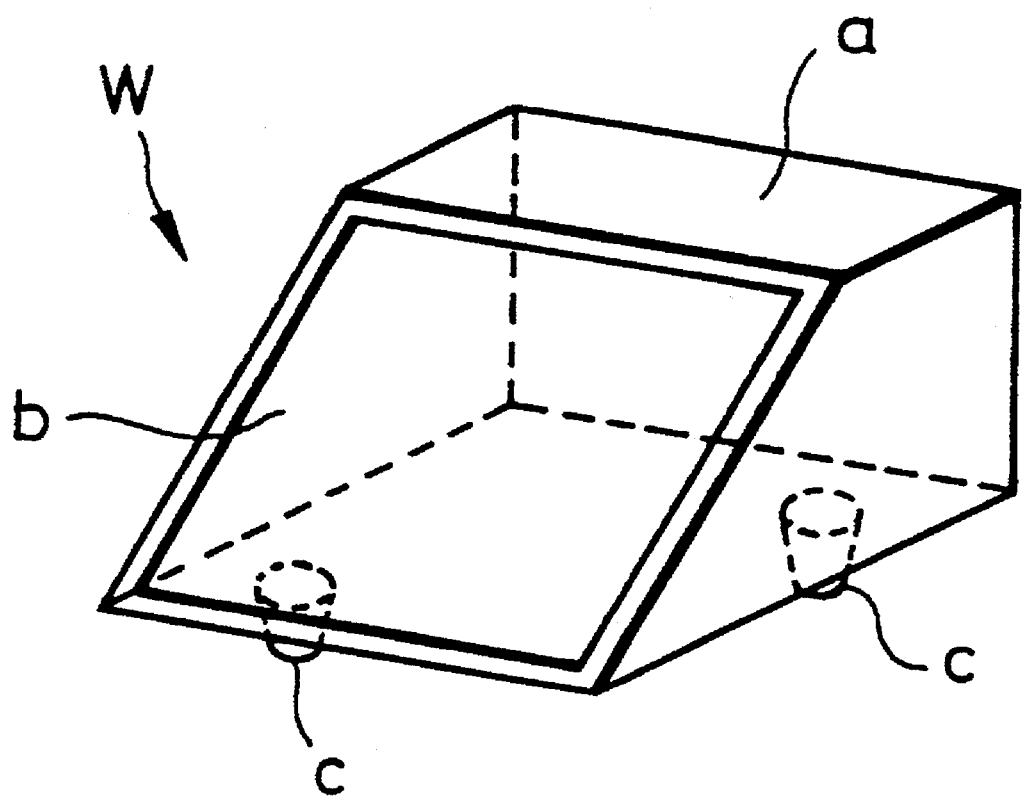
FIG. 6 is a perspective view illustrating a mirror used as parts according to the present invention.

FIG. 6 shows an example of the mirror W. The mirror W is composed of a wedged-shaped block body a having an inclined surface, and a mirror sheet b fastened to the inclined surface of the block body a. Leg members c for attaching the mirror W to a data cartridge are provided on the lower surface of the block body a.

The five chuck units 1A to 1E thus arranged are assembled in the apparatus as shown in FIGS. 4, 5 and used as a tray-type parts rearrangement apparatus 50. This tray-type parts rearrangement apparatus 50 is provided to grasp, one at a time, the five mirrors W accommodated in the tray, and to convey the grasped mirrors W to the destination tray in the rearranged state and with high accuracy. Therefore, the tray-type parts rearrangement apparatus 50 uses two kinds of trays, a parts accommodating tray 40 having a plurality of parts accommodating portions 41 which are low in dimension accuracy for storing the mirrors W, and a parts destination tray 45 having a plurality of parts accommodating portions 46 which are high in dimension accuracy.

The parts accommodating tray 40 is formed by press molding a synthetic resin film. Therefore, the plurality of parts accommodating portions 41 constituted by rectangular concave portions are coarse in dimensional accuracy. On the other hand, the parts destination tray 45 is formed by injection molding of synthetic resin in a metal mold. Therefore, the plurality of parts accommodating portions 46 constituted by rectangular concave portions are higher in dimension accuracy. As a result, while the position accuracy of the mirrors W accommodated in the parts accommodating portion 41 of the parts accommodating tray 40 is so rough as to have errors of, for example, about several millimeters, the position accuracy of the mirrors W moved to the parts accommodating portions 46 of the parts destination tray 46 is very much higher.

The tray-type parts rearrangement apparatus 50 has a grasping and conveying portion 51 having the above-mentioned five chuck units 1A to 1E and a conveying means for conveying the chuck units 1A to 1E, a parts picking-up portion 52 supplied with the parts accommodating tray 40 storing the mirrors W to be grasped by the chuck units 1A to 1E, a tray stock portion 53 in which empty parts accommodating trays 40 are carried and stacked in a predetermined position, a tray supply portion 54 supplied with the parts destination tray 45 to receive the mirrors W carried by the grasping and conveying portion 51, and a tray eject portion 55 by which the parts destination trays 45 filled with the mirrors W are ejected from the apparatus. A tray supply conveyor 56 is disposed adjacent to the grasping and conveying portion 51. The parts accommodating tray 40 conveyed by the tray supply conveyor 56 is introduced into the grasping and conveying portion 51.

A carrying conveyor 60 is an example of the conveying means of the grasping and conveying portion 51. The carrying conveyor 60 is adapted to move and reciprocate the five chuck units 1A to 1E in the horizontal direction between the parts grasping portion 52 and the tray supply portion 54. The parts accommodating tray 40 cleared of the mirrors W is extracted from the parts grasping portion 52 by an accommodating tray elevator 57, conveyed to the tray stock portion 53, and stocked therein. On the other hand, the five chuck units 1A to 1E translate the mirrors W five by five to the parts accommodating portions 46 of the parts destination tray 45 supplied to the tray supply portion 54, and rearrange the mirrors W therein with high accuracy.

If such a transfer work is repeated to thereby move the mirrors W to all the parts accommodating portions 46 of the parts destination tray 45, the parts destination tray 45 is conveyed to the tray discharge portion 55 by a destination tray elevator 58. The parts destination tray 45 that had been conveyed to the tray eject portion 55 is conveyed to the outside of the apparatus by a tray discharge conveyor constituting the tray discharge portion 55. Then, the parts destination tray 45 is conveyed to the next stage, such as a mirror installation process. Subsequently, the mirrors W are installed in data cartridges (not shown) by a robot in the installation process.

The operation of this embodiment will now be described. In such a case that the parts accommodating portions 41 of the parts accommodating tray 40 are coarse in accuracy or the parts accommodating tray 40 is different from the normal one so that a pitch between the parts accommodating portions 41 is fluctuated by about several millimeters, if a number of mirrors W were accommodated in the parts accommodating portions 41 of the parts accommodating tray 40, then the parts accommodating tray 40 could not directly be supplied to and assembled by an automatic assembling machine and the yield will be deteriorated on a large scale. The tray-type parts rearrangement apparatus 50 is intended to effectively improve the yield.

The tray-type parts rearrangement apparatus 50 having such an object is, for example, operated as follows. Using the five chuck units 1A to 1E, five mirrors W can be grasped from the parts accommodating portions 41 of the parts accommodating tray 40 simultaneously, and the five mirrors W can be translated to the parts accommodating portions 46 of the parts destination tray 45 with high accuracy.

Initially, if the parts accommodating tray 40 is supplied to the parts grasping portion 52 of the tray-type parts rearrangement apparatus 50, the five chuck units 1A to 1E of the grasping and conveying portion 51 are moved above the parts grasping portion 52, and their main chucks 2a to 2e are respectively disposed above the mirrors W which are accommodated in the parts accommodating portions 41 of the parts accommodating tray 40 and which should be moved. At this time, the chuck levers 17 and 17 of each of the sub-chucks 3a to 3e that are respectively associated with the main chucks 2a to 2e, are closed by the operation of the moving members 15, 15, respectively, so that the chuck levers 17 and 17 hold the associated grip shaft 30.

Therefore, since the main chucks 2a to 2e are rendered movable by the floating mechanism constituted by a combination of the sliding member 21 and the guide plate 20, are held by the sub-chucks 3a to 3e through the hold shafts 30, the main chucks 2a to 2e are brought into the fixed state from the released state. This state is the original position of the grasping and conveying portion 51 wherein the distances between the respective main chucks 2a to 2e are set to predetermined ones. Then, the chuck levers 28, 28 of each of the main chucks 2a to 2e are opened.

In this state, the whole of the chuck units 1A to 1E of the grasping and conveying portion 51 are lowered, and further lowered also after the abutting members 26 provided on the lower surfaces of the main chucks 2a to 2e abut against the mirrors W, respectively. The respective main chucks 2a to 2e are elevated relatively to the guide bars 6 by the reaction force from the mirrors W. At this time, the respective main chucks 2a to 2e are separately coupled with the movable arms 4a to 4e through their associated mounting members 22, sliding members 21, guide plates 20, fixing members 16, hold shafts 30 and sub-chucks 3a to 3e. Therefore, these movable arms 4a to 4e and so on are guided by the guide bars 6 and elevated integrally relative to the guide bars 6.

In this case, the light shielding members 10 are elevated together with the movable arms 4a to 4e, respectively. When the light shielding members 10 are elevated to predetermined heights, their associated sensors 11 output detection signals. Consequently, the whole of the chuck units 1A to 1E are prevented from being lowered, and brought into the state shown in FIG. 1. This is the state that the lowering ends of the chuck units IA to 1E are detected.

At this time, if the mirrors W are accommodated in the respective accommodating portions of the parts accommodating tray 40, then their associated main chucks 2a to 2e are elevated relatively to the guide bars 6 respectively, so that all the sensors 11 associated with the respective movable arms 4a to 4e output detected signals. On the other hand, a detected signal is not output from the sensor 11 associated with the accommodating portion storing no mirror W. In such a manner, it is detected whether parts are accommodated in the parts accommodating tray 40 or not.

Particularly, at this time, while the tray pressing member 35 contacts with the partition portions 42a of the tray 40, the lower ends of the chuck levers 28, 28 of each of the main chucks 2a to 2e do not contact the small partition portions 42b, and the respective mirrors W are interposed between the chuck levers 28 and 28.

On the basis of the detected information from the sensors 11, the respective sub-chucks 3a to 3e are operated to move the pair of moving members 15 and 15 away from each other, so that the chuck levers 17, 17 are opened. Thus, the hold shafts 30 are released from the holding state, respectively. As a result, the respective main chucks 2a to 2e are released from the fixed state and restricted against moving by only the floating mechanism, and thus are rendered movable in the direction perpendicular to the sheet of FIG. 2 relatively to the guide plates 20. After the opened states of the chuck levers 17, 17 of the sub-chucks 3a to 3e are confirmed on the basis of the detected signals from the lever open and close detection sensors 34, the main chucks 2a to 2e are operated to close their associated chuck levers 28, 28, so as to grasp the mirrors W with the chuck levers 28, 28.

In this case, although the respective main chucks 2a to 2e are set into predetermined positions by the sub-chucks 3a to 3e till they are brought into the released state, the respective mirror positions vary and are not set into predetermined positions. Accordingly, the main chucks 2a to 2e are guided by the guide plates 20 and translated by the distances corresponding to the errors, respectively. At this time, the force generated by the slide resistance between the guide plate 20 and the sliding member 21 is made smaller than the grasping force of each of the main chucks 2a to 2e. Therefore, the mirrors W remain held in the parts accommodating portions 41, and only the main chucks 2a to 2e are translated toward the centers of the mirrors W. This movement is performed between the chuck levers 28, 28, and the amount of the movement is normally several millimeters or smaller. Therefore, in this state, the distances between the five main chucks 2a to 2e are changed with the accuracy of the parts accommodating portions 41, and vary by about several millimeters.

The closed state of the chuck levers 28, 28 of the main chucks 2a to 2e are confirmed on the basis of the detected signals from the lever open and close detection sensors 32. Thereafter, the whole of the chuck units 1A to 1E are elevated. If the elevating ends of the chuck units 1A to 1E are detected, the sub-chucks 3a to 3e are operated to close the chuck levers 17, 17. Accordingly the chuck levers 17, 17 hold the hold shafts 30, so that the main chucks 2a to 2e are fixed by the sub-chucks 3a to 3e. As a consequence, the five main chucks 2a to 2e are all locked in predetermined positions, so that the distances between the main chucks 2a to 2e are set to a predetermined equal distance.

Then, the five chuck units 1A to 1E are conveyed to the tray supply portion 54 by the carrying conveyor 60 of the grasping and conveying portion 51. The chuck units 1A to 1E are lowered in the tray supply portion 54, and the chuck levers 28, 28 of each of the main chucks 2a to 2e are opened, so that the mirrors W are respectively translated to the parts accommodating portions 46 of the parts destination tray 45 conveyed to the tray supply portion 54. In this case, since the five main chucks 2a to 2e are all set into predetermined positions, all the mirrors W can be moved and rearranged in the parts destination tray 45 with high accuracy.

While the present invention is described so far, the present invention is not limited to the above-mentioned embodiment. By way of example, although reflection-type photo sensors are used as the sensors 11 as described above, the reason that such sensors are used is that magnetic products are used for the data storage, and there is then the risk that the data storage will be smudged by magnetic powders to cause a drop-out. Therefore, if there is no risk that the data storage is smudged by magnetic powders or the like, then it is of course possible to use sensors made of magnets. Although the five chuck units 1A to 1E are used as described above, four or less, or six or more chuck units may be used.

Although such parallel chucks in which the chuck levers 17, 17, and 28, 28 are translated in parallel to each other are used as both the main chucks 2a to 2e and the sub-chucks 3a to 3e as described above, chucks of any other type may be used. Although the mirrors W for data cartridges are used as parts to be grasped up by the chucks as described above, parts for any other product may of course be used, and parts that are also finished products may be used.

As has been described above, the parts picking-up and carrying apparatus according to the present invention has main chucks, sub-chucks, a floating mechanism and a conveying means, and the main chucks are brought into the released state when the parts are grasped, and the main chucks are translated toward the centers of the parts after the parts are grasped. Accordingly, there is obtained an effect that it is easy to grasp the parts accommodated in parts accommodating portions which are low in accuracy, and it is, for example, possible to accurately convey the parts to parts accommodating portions of another tray, or accurately assemble the parts in predetermined positions of a machine to be assembled, or the like.

In addition, if the parts accommodating portions and the parts destinations are made into trays, then it is possible to move parts from one tray to the other tray in order with high accuracy by a conveying means. Therefore, the present invention can contribute to the automation of the production line in such an apparatus.

Further, it is possible to provide a parts grasping and conveying apparatus by which a plurality of parts can be grasped and conveyed from one tray to the other easily simultaneously, and by which without making the structure of the apparatus complicated, with a simple structure, parts can be grasped easily and conveyed with high accuracy.

If the nearby parts accommodated in parts accommodating portions of a tray are pressed by a tray pressing member when the parts are grasped by main chucks, the tray is restrained from being deformed. Thus, it is possible to improve the accuracy with which the parts are grasped.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A parts conveying apparatus for grasping parts accommodated in a first parts accommodating portion and for conveying the grasped parts to a second parts accommodating portion, comprising:

a plurality of main chucks, each having a first pair of chuck members movable in a first direction between a closed position wherein a part is grasped and an opened position;

a plurality of support members for supporting said plurality of main chucks so that said plurality of main chucks are each independently slidable in said first direction;

a plurality of sub-chucks each of which move in unison with one of said plurality of support members, each of said sub-chucks having a second pair of chuck members movable between a closed position wherein they grasp a rod-like member to fix a corresponding one of said plurality of main chucks in a predetermined position, and an opened position to allow said corresponding one of said main chucks to slide in said first direction along a support member; and conveying means for conveying said plurality of main chucks and said plurality of sub-chucks from a first position in which said first parts accommodating portion can be accessed to a second position in which said second parts accommodating portion can be accessed, wherein when said parts are grasped in said first parts accommodating portion, said first chuck members are moved from said opened positions to said closed positions while said second chuck members are set in said opened positions, whereafter said second chuck members are closed and said plurality of main chucks become fixed in said predetermined positions.

2. The apparatus according to claim 1, further comprising a plurality of movable arms for integrally holding said plurality of support members and said plurality of sub-chucks, a base member for holding said plurality of movable arms so that said movable members can independently be elevated and lowered, drive means for moving said base member in the upper and lower direction, and a plurality of detecting means for detecting height positions of said plurality of movable arms relative to said base member, respectively.

3. The apparatus according to claim 1, wherein said first parts accommodating portion is made coarse in accommodating accuracy as compared with said second parts accommodating portion.

4. A parts conveying apparatus for grasping parts accommodated in a first parts accommodating portion and for conveying the parts which are grasped to a second parts accommodating portion, comprising:

a plurality of main chucks, each having a first pair of chuck members movable in a first direction between a closed position wherein a part is grasped and an opened position;

a plurality of support members for supporting said plurality of main chucks so that said plurality of main chucks are each independently slidable in said first direction;

a plurality of sub-chucks each of which move in unison with one of said plurality of support members, each of said sub-chucks having a second pair of chuck members movable between a closed position wherein they grasp a rod-like member to fix a corresponding one of said plurality of main chucks in a predetermined position, and an opened position to allow said corresponding one of said main chucks to slide in said first direction along a support member; and conveying means for conveying said plurality of main chucks and said plurality of sub-chucks from a first position in which said first parts accommodating portion can be accessed to a second position in which said second parts accommodating portion can be accessed, wherein when the parts which are grasped in said first parts accommodating portion, said first chuck members are moved from said opened positions to said closed positions while said second chuck members are set in said opened positions, whereafter said second chuck members are closed and said plurality of main chucks are fixed in said predetermined positions;

wherein friction force generated by a slide resistance between said main chucks and said support members is smaller than a force with which said main chucks grasp said parts.

5. A parts conveying apparatus for grasping a part accommodated in a first parts accommodating portion, and conveying the part which is grasped to a second parts accommodating portion, comprising:

a main chuck having a first chuck member movable in a first direction between a closed position to grasp the part and an opened position to release said part;

a support member for supporting said main chuck so that said main chuck is slidable in said first direction;

a sub-chuck formed so as to move with said main chuck, said sub-chuck having a second chuck member movable between a closed position to fix said main chuck at a predetermined position, and an opened position to allow said main chuck to slide in said first direction; and conveying means for conveying said main chuck and said sub-chuck from a first position in which said first parts accommodating portion can be accessed to a second position in which said second parts accommodating portion can be accessed, and wherein when the part in said first parts accommodating portion is grasped, said first chuck member is moved from said opened position to said closed position while said second chuck member is set in said opened position, and whereafter said second chuck member is moved from said opened position to said closed position and moves said first chuck to a predetermined position, said second chuck member being maintained in said closed position until said conveying means conveys said main chuck and said sub-chuck to said second position and the part which is grasped is located in said second parts accommodating portion.

6. The apparatus according to claim 5, wherein said first parts accommodating portion is made coarse in accommodating accuracy as compared with said second parts accommodating portion.

7. A parts conveying apparatus for grasping a part accommodated in a first parts accommodating portion, and conveying the part which is grasped to a second parts accommodating portion, comprising:

a main chuck having a first chuck member movable in a first direction between a closed position to grasp the part and an opened position to release the part;

a support member for supporting said main chuck so that said main chuck is slidable in said first direction;

a sub-chuck formed so as to move with said main chuck, said sub-chuck having a second chuck member movable between a closed position to fix said main chuck at a predetermined position, and an opened position to allow said main chuck to slide in said first direction; and conveying means for conveying said main chuck and said sub-chuck from a first position in which said first parts accommodating portion can be accessed to a second position in which said second parts accommodating portion can be accessed, and wherein, when the part in said first parts accommodating portion is grasped, said first chuck member is moved from said opened position to said closed position while said second chuck member is set in said opened position, and whereafter said second chuck member is moved from said opened position to said closed position and moves said first chuck to a predetermined position, said second chuck member being maintained in said closed position until said conveying means conveys said main chuck and said sub-chuck to said second position and the part which is grasped is located in said second parts accommodating portion;

wherein a friction force generated by a slide resistance between said main chucks and said support members is smaller than a force with which said main chuck grasps the part.

\* \* \* \* \*